(12) United States Patent
Choi et al.

(10) Patent No.: US 7,214,117 B2
(45) Date of Patent: May 8, 2007

(54) DEFLECTOR OF A MICRO-COLUMN ELECTRON BEAM APPARATUS AND METHOD FOR FABRICATING THE SAME

(75) Inventors: Sang Kuk Choi, Daejon-Shi (KR); Dae Yong Kim, Daejon-Shi (KR); Dong Yel Kang, Busan-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 519 days.

(21) Appl. No.: 10/853,519

(22) Filed: May 26, 2004

(65) Prior Publication Data

US 2004/0217299 A1 Nov. 4, 2004

Related U.S. Application Data

(62) Division of application No. 10/617,703, filed on Jul. 14, 2003, now Pat. No. 6,797,963.

(30) Foreign Application Priority Data

Nov. 22, 2002 (KR) ............................... 2002-72975

(51) Int. Cl.
*H01L 21/00* (2006.01)
(52) U.S. Cl. .............................. 445/24; 445/50; 438/20
(58) Field of Classification Search .................. 445/24, 445/50; 438/20
See application file for complete search history.

(56) References Cited

U.S. PATENT DOCUMENTS 6,797,963 B2 * 9/2004 Choi et al. .............. 250/396 R

FOREIGN PATENT DOCUMENTS

KR 2001-51486 6/2001

OTHER PUBLICATIONS

L. P. Muray, et al.; "Advances in arrayed microcolumn lithography"; J. Vac. Sci. Technol. B 18(6) ; Nov./Dec. 2000; American Vacuum Society; pp. 3099-3103.

* cited by examiner

*Primary Examiner*—Kiet T. Nguyen
(74) *Attorney, Agent, or Firm*—Lowe Hauptman & Berner LLP

(57) ABSTRACT

The present invention relates to a deflector of a micro-column electron beam apparatus and method for fabricating the same, which forms a seed metal layer and a mask layer on both sides of a substrate, and exposes some of the seed metal layer on which deflecting plates, wirings and pads are to be formed by lithography process using a predetermined mask. The wirings and pads are formed by plating metal on the exposed portion, and some of the metal layer is also exposed on which the deflecting plates are to be formed using a predetermined mask, and then the metal is plated with desired thickness, thereby the deflecting plates are completed. Therefore, by forming plurality of deflecting plates on both sides of the substrate at the same time through plating process, alignment between the deflecting plates formed on both sides of the substrate can be exactly made, and by fabricating a deflector integrated with the substrate and deflecting plates in a batch process, productivity and reproducibility is improved. In addition, since the deflecting plates, wirings and pads are directly formed on the substrate, structural safety is improved and thereby durability is also improved.

7 Claims, 7 Drawing Sheets

DEFLECTOR OF A MICRO-COLUMN ELECTRON BEAM APPARATUS AND METHOD FOR FABRICATING THE SAME

This is a divisional application of prior application Ser. No. 10/617,703 filed on Jul. 14, 2003 now U.S. Pat. No. 6,797,963.

BACKGROUND OF THE INVENTION

1. Field of the Invention

The present invention relates to a deflector positioned between electron beam lens in a micro-column electron beam apparatus used for exposure process for patterning a photoresist film, and more specifically to a deflector having a plurality of deflecting plates correspondingly arranged at the upper and lower sides thereof and method for fabricating the same.

2. Description of the Prior Art

In general, a micro-column electron beam apparatus is used in an exposure process for patterning a photoresist film. In the micro-column electron beam apparatus, the photoresist film is exposed to a designed form by electron beam emitted from a cathode. The micro-column electron beam apparatus consists of electron beam lens through which the electron beam passes, and a deflector that electrically controls direction of the electron beam and positioned between the electron beam lenses. The micro-column electron beam apparatus receives data of a designed form from a pattern generator, and irradiates the electron beam to a photoresist film formed on a mask or wafer with a direction commanded by the data. Thereby, the photoresist film is exposed to the designed form.

The deflector has pairs of 2~16 deflecting plates arranged opposite to each other at the upper and lower sides of the deflector. The deflecting plates control the path of the electron beam in accordance with the data supplied from the pattern generator.

In fabrication process of the deflector, the deflecting plates are made by a wet etching or Deep RIE (reactive ion etch) process of a silicon wafer having a thickness of 0.2 mm to 1 mm, and anodic bonded on both sides of a base isolation plate consisted of Pyrex Glass, etc. However, as this conventional method has to make deflecting plates and fix them on both sides of the base isolation plate, alignment and uniformity between the deflecting plates cannot be easily improved, and reproducibility and structural durability cannot also be improved.

SUMMARY OF THE INVENTION

It is therefore an object of the present invention is to provide a deflector of a micro-column electron beam apparatus capable of eliminating above mentioned disadvantages by forming simultaneously plurality of deflecting plates at the upper and lower sides of the base isolation plate though metal plating process, and method for fabricating the same.

To achieve the above object, the deflector of a micro-column electron beam apparatus in accordance with the present invention comprises an isolation substrate having a hole formed at center of the isolation substrate; plurality of deflecting plates formed along circumference of the hole at upper and lower sides of the isolation substrate; plurality of pads formed on edges of the upper and lower sides of the isolation substrate; and plurality of wirings for connecting each of the deflecting plates and each of the pads, wherein the deflecting plates, wirings, and pads are formed integrated.

A hole through which electron beams pass is formed within the hole by arrangement of deflecting plates, and the deflecting plates are arranged opposite to each other with the isolation substrate.

The isolation substrate is made of ceramic alumina, and the deflecting plates, wirings, and pads are made of beryllium, phosphor bronze, bronze, cupro-nickel, stainless steel, or nickel, and formed by plating process.

In addition, a method for fabricating a deflector of a micro-column electron beam apparatus in accordance with the present invention comprises a step of burying and hardening polymer in a hole formed at center of a substrate; a step of forming first mask pattern so that some portion of seed metal layers is exposed to form deflecting plates, wirings and pads after forming the seed metal layers on both surfaces of the substrate; a step of forming first metal layers on the exposed portion of the seed metal layers; a step of forming second mask pattern on both surfaces of the substrate to expose the first metal layers in which the deflecting plates are to be formed; a step of forming second metal layers on the exposed portion of the first metal layers; a step of removing the first and second mask patterns; and a step of removing the seed metal layers exposed and polymers buried in the hole.

The first mask pattern is a photoresist film, and formed by coating or laminating process, and the first and second metal layers are made of beryllium, phosphor bronze, bronze, cupro-nickel, stainless steel, or nickel, and formed by plating process.

The second mask pattern consists of polymers, and formed by laminating process.

The step for removing polymers buried in the hole further comprises a step for plating metal on exposed surfaces of the first and second metal layers.

Although the present invention has been described in conjunction with the preferred embodiment, the present invention is not limited to the embodiments, and it will be apparent to those skilled in the art that the present invention can be modified in variation within the scope of the invention.

BRIEF DESCRIPTION OF THE DRAWINGS

The above and other objects, effects, features and advantages of the present invention will become more apparent by describing in detail the preferred embodiment of the present invention with reference to the attached drawings in which.

Similar reference characters refer to similar parts in the several views of the drawings.

DESCRIPTION OF THE PREPERRED EMBODIMENT

Silicon is used as a conductive material and Pyrex is used as a base isolation plate in prior art. However, metals such as beryllium, phosphor bronze, stain, nickel etc. are used as the conductive material in the present invention, and ceramic alumina as the base isolation plate, and deflecting plates of conductive materials are fabricated using plating process. Bronze is used as a representative metal for explaining the present invention, however, it should be understand that any metal that confirm to the purpose of the present invention can be used.

Hereinafter, embodiments of the present invention will be explained with reference to the accompanying drawings. In an embodiment of the present invention, eight deflecting plates called octapole are formed on the upper and lower sides of the deflector, respectively, and the eight deflecting plates are opposite to each other.

Figure 1:
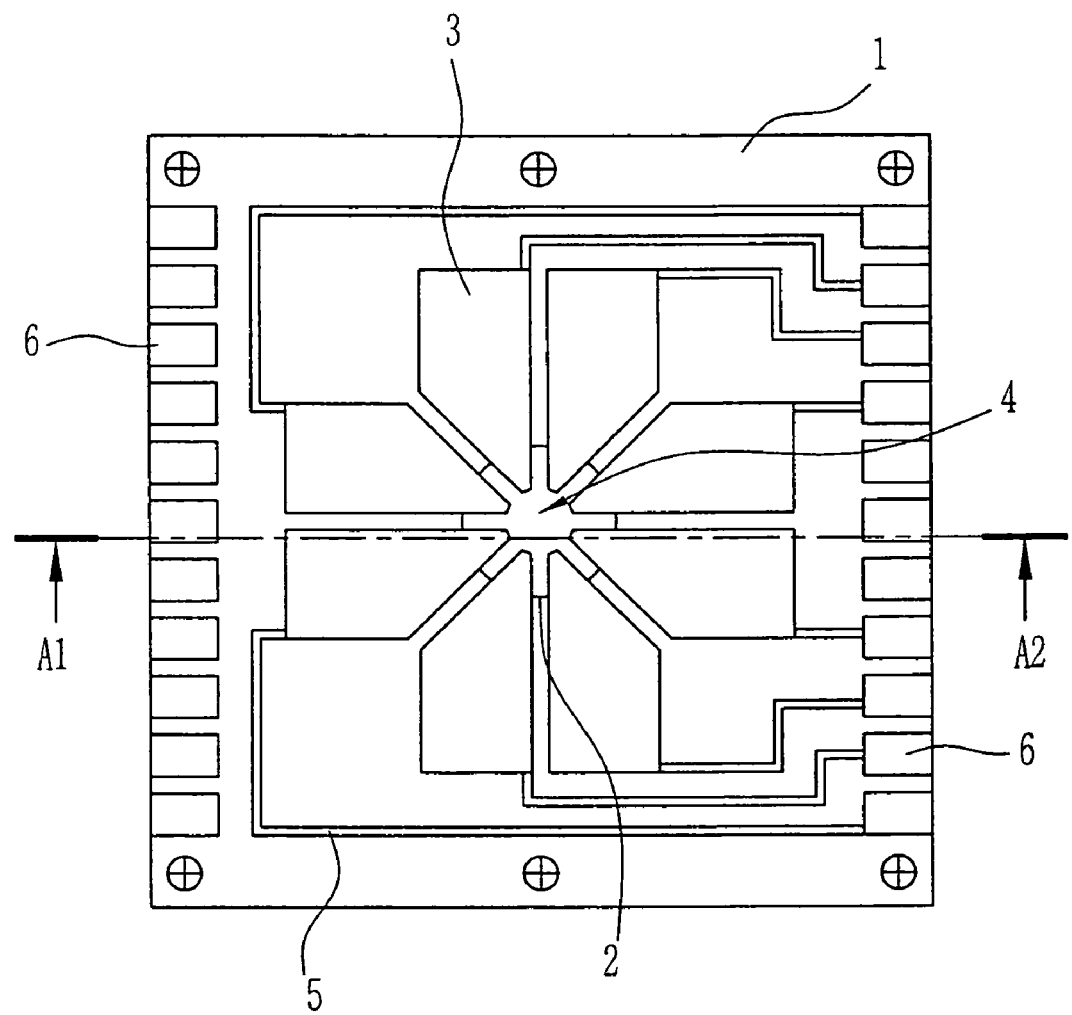
FIG. 1 shows a plane view for explaining a deflector of a micro-column electron beam apparatus in accordance with an embodiment of the present invention.
Figure 2:
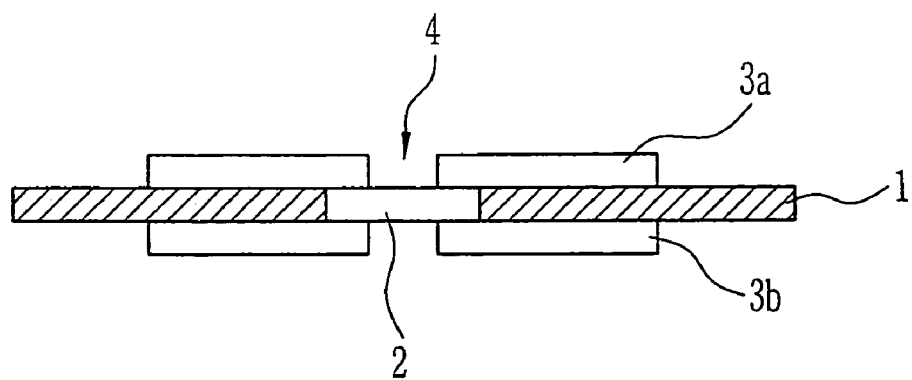
FIG. 2 shows a cross sectional view taken along the A1–A2 line of FIG. 1.

The deflector of the micro-column electron beam apparatus in accordance with the present invention, for example, consists of an isolation substrate 1 in which a hole 2 with 2 mm to 3 mm caliber is formed in the center of the isolation substrate 1, and eight deflecting plates 3 formed on upper and lower sides of the isolation substrate 1, respectively, and arranged along the circumference of the hole 2 as shown in FIG. 1. Upper deflecting plates 3a and lower deflecting plates 3b are arranged opposite to each other with the isolation substrate 1 as shown in FIG. 2, a hole 4 with 500 µm to 1 mm caliber is formed through which electron beams pass within the hole 2 by the arrangement of the deflecting plates 3. In addition, pads 6 are formed at both edges of the isolation substrate 1, and connected to each of the deflecting plates 3 through wirings 5.

Figure 3:
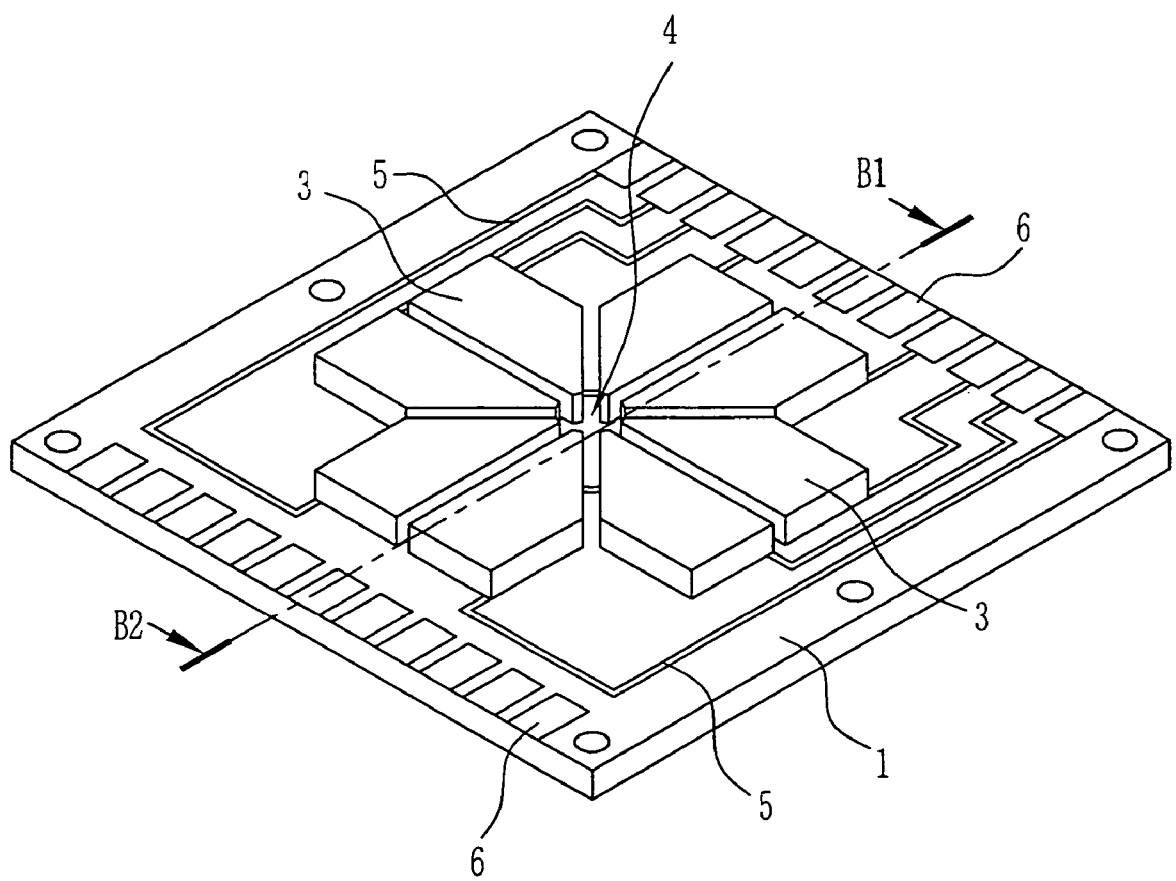
FIG. 3 shows a perspective view for explaining a deflector of a micro-column electron beam apparatus in accordance with an embodiment of the present invention.
Figure 4:
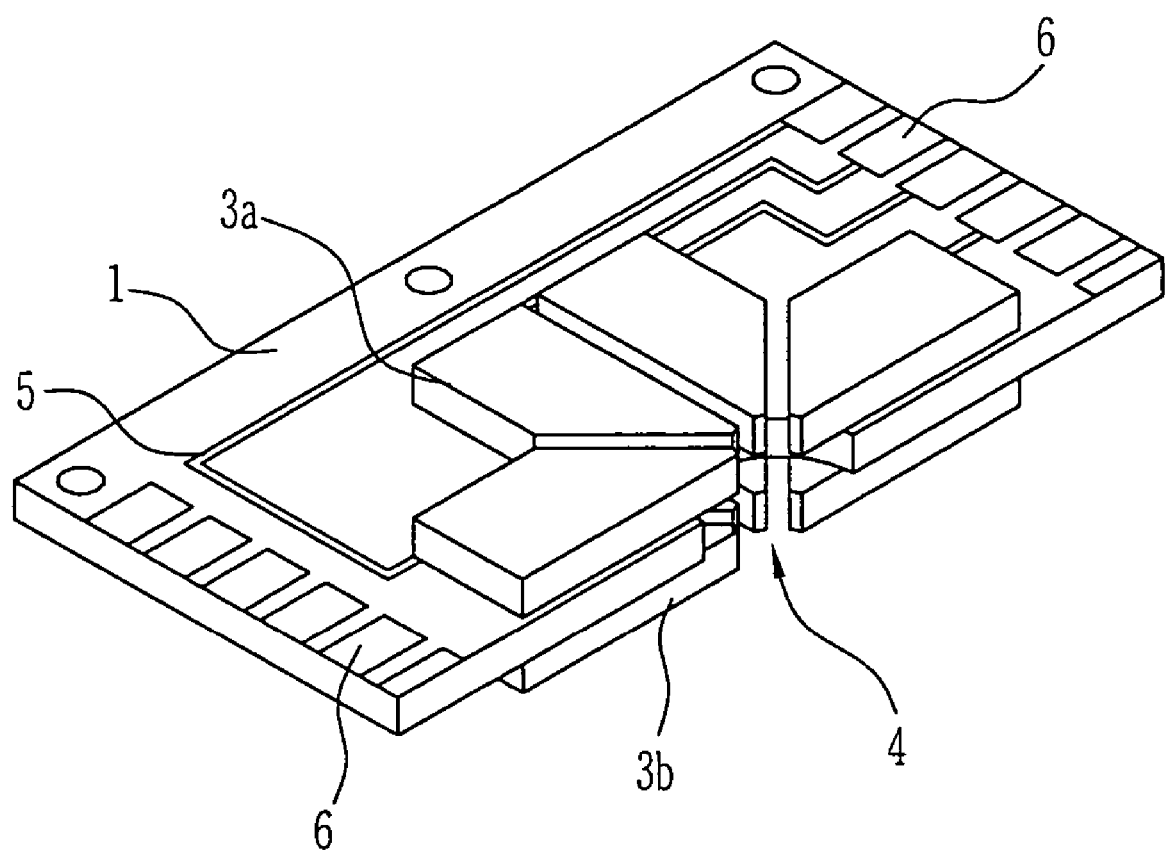
FIG. 4 shows a cross sectional view taken along the line B1–B2 of FIG. 3.

FIG. 3 shows a perspective view for explaining the deflector as shown in FIG. 1, and FIG. 4 shows a cross sectional view taken along the line B1–B2 of FIG. 3.

A method for fabricating deflector of a micro-column electron beam apparatus in accordance with the present invention will be described below.

Figure 5A:
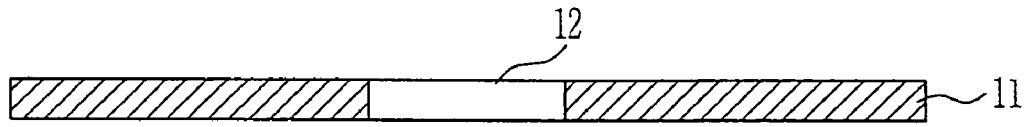
FIG. 5A to 5M show cross sectional views for explaining method for fabricating the deflector of the micro-column electron beam apparatus in accordance with the present invention.

Referring to FIG. 5A, a hole 12 with 2 mm to 3 mm caliber is formed at the center of the rectangular isolation substrate 11 made of ceramic alumina with 500 µm in thickness.

Figure 5B:
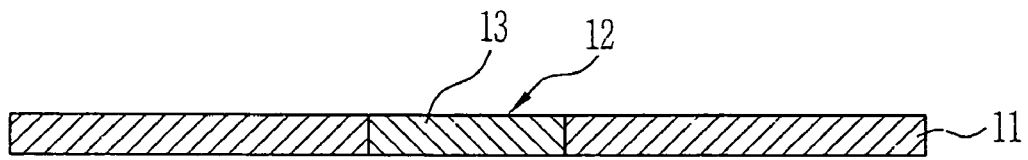

Referring to FIG. 5B, polymer 13 in kneading condition is buried to the hole 12 and hardened, and the polymer 13 on both surfaces of the isolation substrate 11 is polished so that those surfaces are planarized.

Figure 5C:
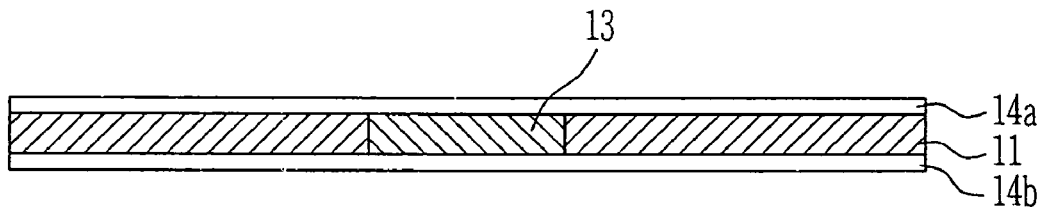

Referring to FIG. 5C, seed metal layers 14a and 14b are vacuum deposited on both surfaces of the isolation substrate 11.

Figure 5D:
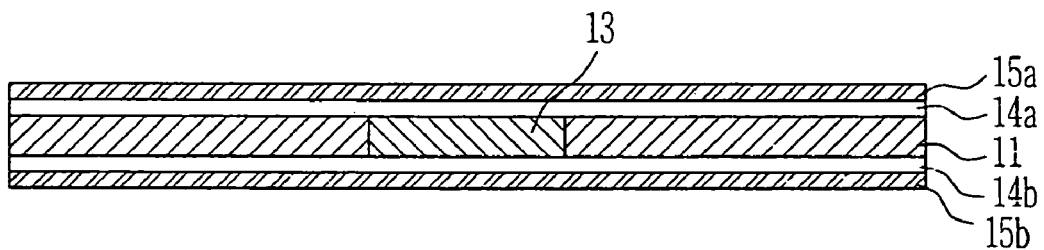

Referring to FIG. 5D, photoresist films 15a and 15b are formed on each of seed metal layers 14a and 14b. The photoresist films 15a and 15b are formed by coating or laminating of the photoresist materials.

Figure 5E:
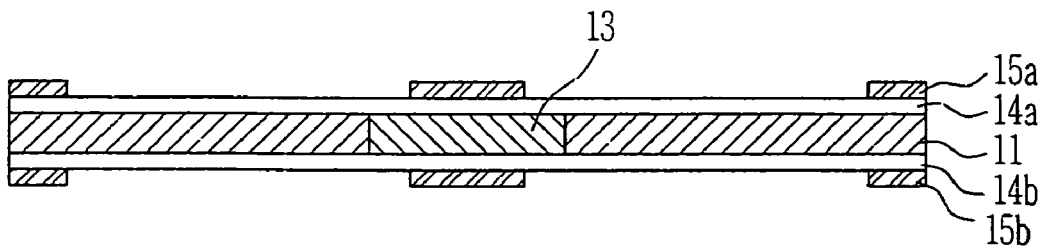
Figure 6:
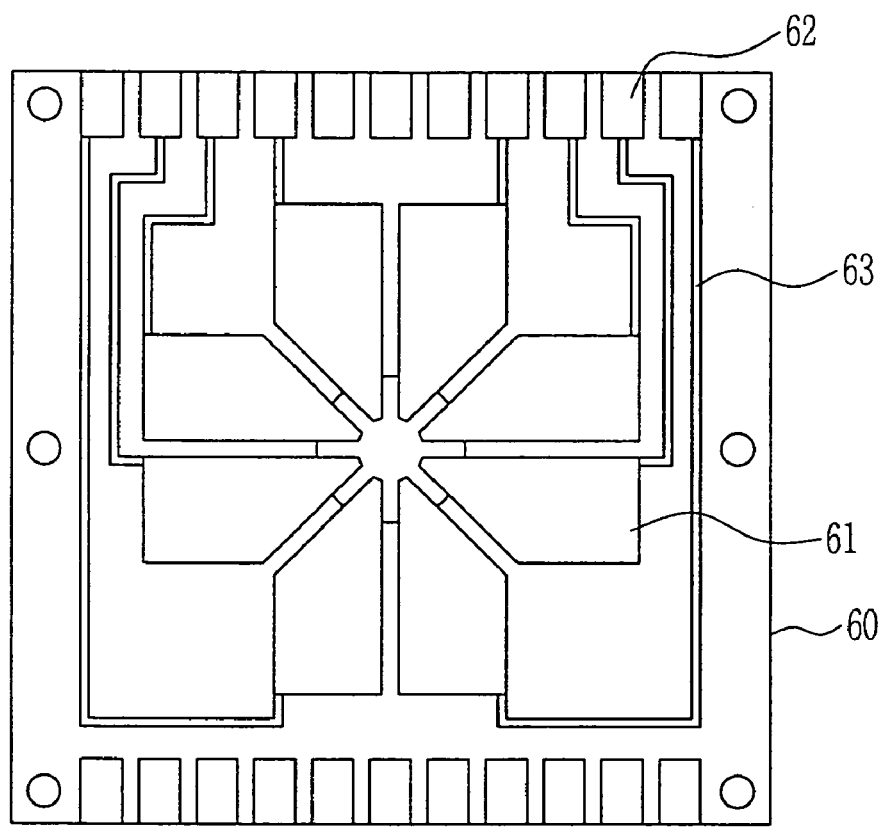
FIG. 6 shows a plane view of a mask for explaining FIG. 5E.

Referring to FIG. 5E, the photoresist films 15a and 15b are patterned through exposing and developing processes using mask 60 formed with deflecting plate pattern 61, pad pattern 62, and wiring pattern 63 as shown in FIG. 6, and some of the seed metal layers 14a and 14b are exposed to form the deflecting plate, pad and wiring.

Figure 5F:
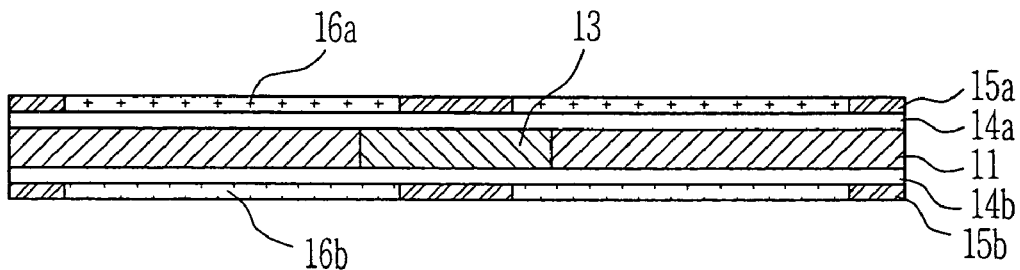

Referring to FIG. 5F, metal layers 16a and 16b with 2 µm to 35 µm in thickness are formed on exposed portion of the seed metal layers 14a and 14b by a plating process. The metal layers 16a and 16b corresponding to the pad pattern 62 and wiring pattern 63 are used to the wiring 5 and the pad 6 shown in FIG. 1. At this time, heights of the metal layers 16a and 16b should be the same as those of the photoresist films 15a and 15b, and the metal used for the plating is beryllium, phosphor bronze, bronze, cupro-nickel, stainless steel, nickel, etc.

Figure 5G:
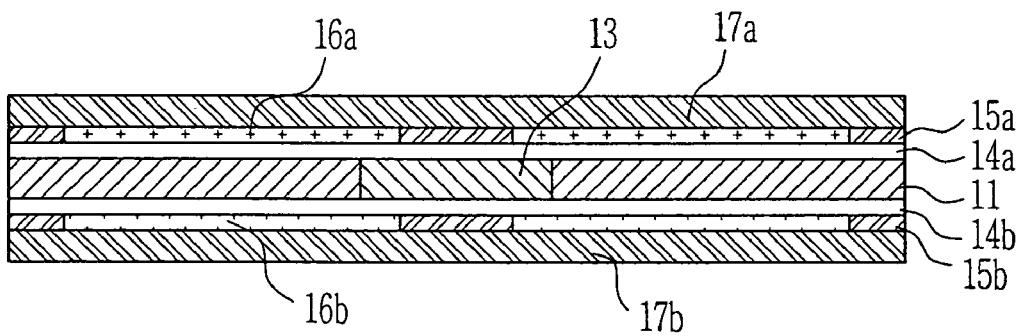

Referring to FIG. 5G, polymer layers 17a and 17b with 200 µm to 500 µm in thickness are formed on all surfaces of the isolation substrate 11 by a laminating process. The thickness of the polymer layers 17a and 17b are adjusted in consideration of the thickness of the deflecting plate.

Figure 5H:
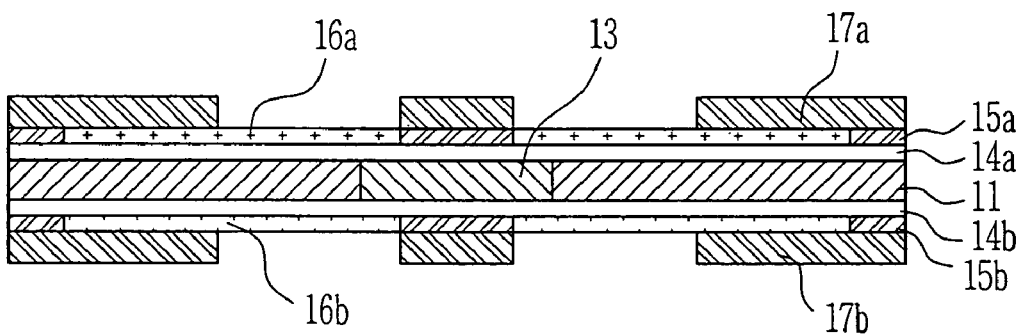
Figure 7:
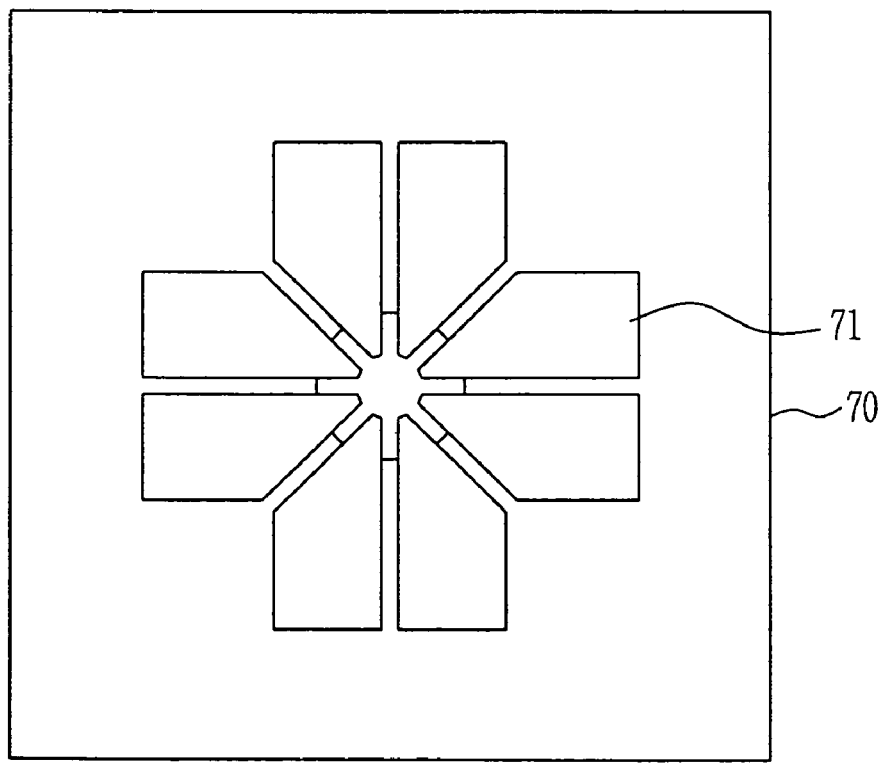
FIG. 7 shows a plane view of a mask for explaining FIG. 5H.

Referring to FIG. 5H, the polymer layers 17a and 17b are patterned through photography and etching processes using mask 70 formed with deflecting pattern 71 as shown in FIG. 7, and some portions of the metal layers 16a and 16b is exposed to form the deflecting plates. The etching process for patterning the polymer layers 17a and 17b is performed with Deep RIE (Reactive Ion etch).

Figure 5I:
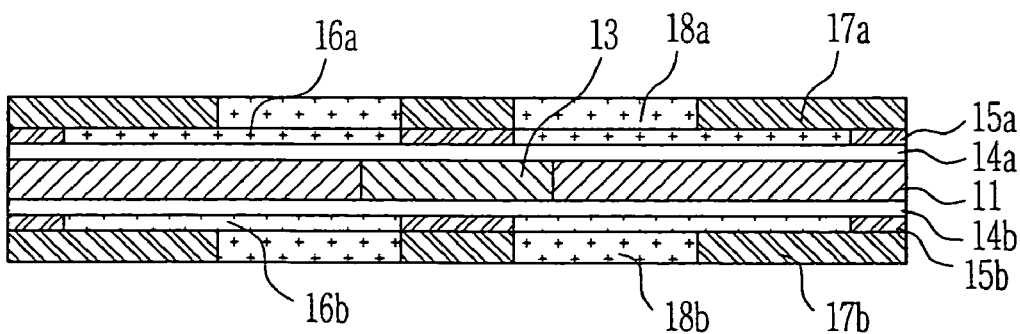

Referring to FIG. 5I, metal layers 18a and 18b with 200 µm to 500 µm in thickness are formed on exposed portion of the metal layers 16a and 16b by a plating process. The deflecting plates 3 as shown in FIG. 1 are completed by, stacked metal layers 16a and 16b and metal layers 18a and 18b. At this time, heights of the metal layers 18a and 18b should be the same as those of the polymer layers 17a and 17b to have a required thickness of the deflecting plate, and the metal used for the plating is beryllium, phosphor bronze, bronze, cupro-nickel, stainless steel, nickel, etc.

Figure 5J:
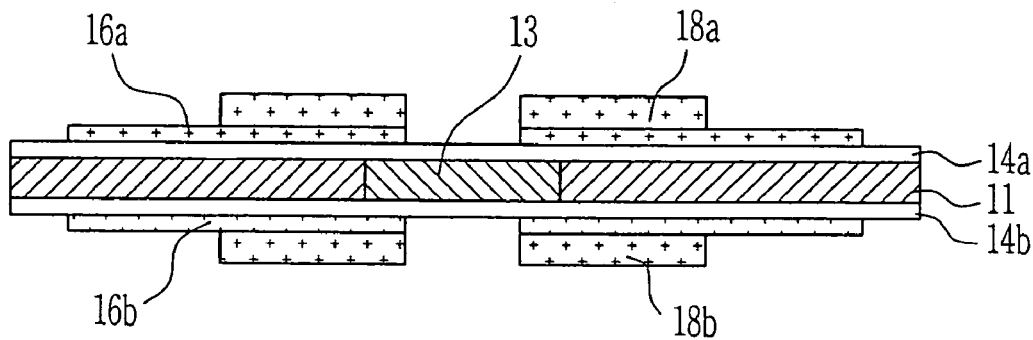

Referring to FIG. 5J, the polymer layers 17a and 17b and the photoresist films 15a and 15b are removed by using solvent.

Figure 5K:
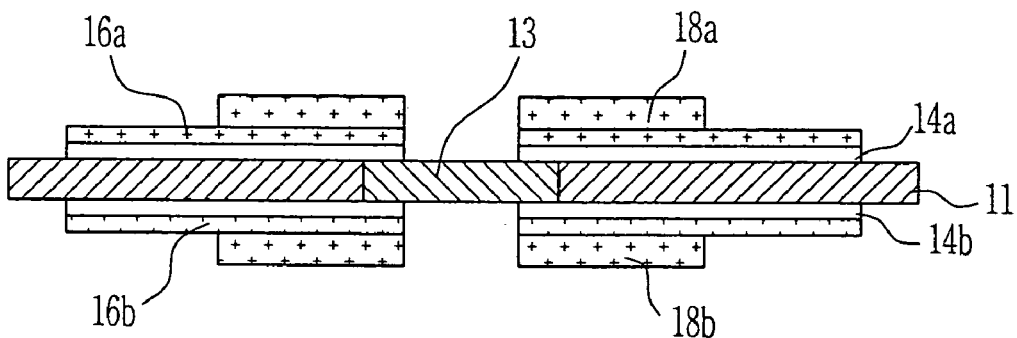

Referring to FIG. 5K, exposed portion of the seed metal layers 14a and 14b are removed.

Figure 5L:
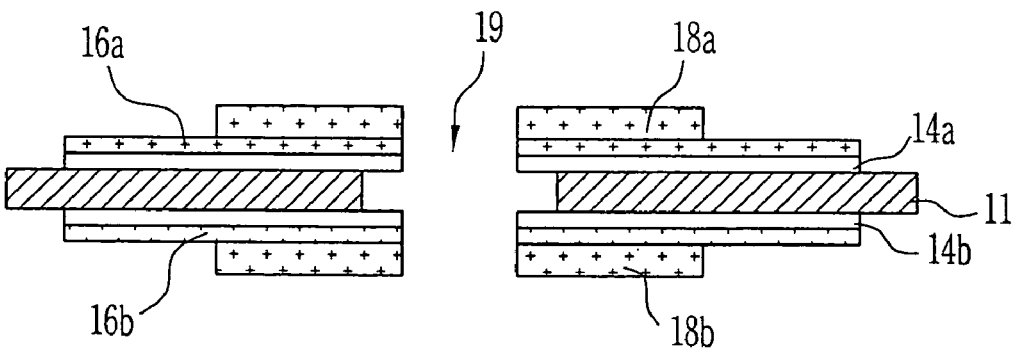

Referring to FIG. 5L, a hole 19 is formed through which the electron beams pass by oxidizing polymers 13 to be removed at about 500° C. buried in the hole 12 of the isolation substrate 11.

Figure 5M:
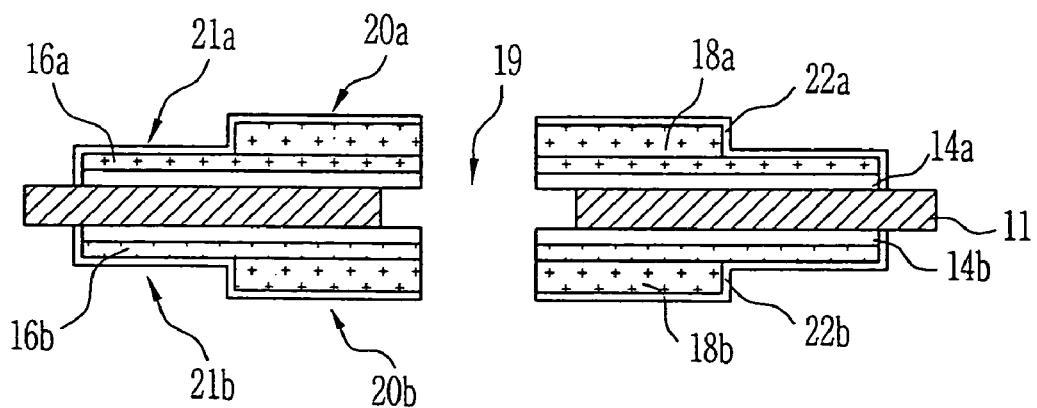

Referring to FIG. 5M, metal (Au; 22a and 22b) is plated on exposed surfaces of upper and lower deflecting plates 20a and 20b stacked with metal layers 16a and 16b and metal layers 18a and 18b, upper and lower wirings and pads 21a and 21b consisted of seed metal layers 14a and 14b and metal layers 16a and 16b. The metal is plated in thickness of 0.1 µm to 0.5 µm.

A deflector having eight deflecting plates respectively formed on the upper and lower sides of the substrate has been described in the present invention, however, the deflector having deflecting plates formed only at the upper or lower side of the substrate can also be fabricated.

As mentioned above, the present invention exposes some portion of the seed metal layers in which deflecting plates, wirings, and pads are to be formed by photolithography process using a predetermined mask, after forming seed metal layers on both surfaces of a substrate. Wirings and pads are formed by plating metal on the exposed portion, and some portion in which the deflecting plates are to be formed by lithography process using a predetermined mask is exposed, and then the deflecting plates are formed by plating metal with required thickness.

Since plurality of deflecting plates are formed on both sides of the substrate through metal plating at the same time, alignment between those deflecting plates and corresponding relation between those deflecting plates on upper and lower part of the substrate is made exact, and productivity and reproducibility is improved by fabricating the deflector integrated with the substrate and deflecting plates.

Furthermore, since the deflecting plates, wirings and pads are directly formed on the substrate, structural safety is improved and thereby durability is also improved.

In addition, the present invention forms the polymer layers used as a mask layer by laminating process when performing metal plating, the polymers can be easily formed and removed, shape (rectangular degree) and size of side wall of the deflecting plate can be exactly controlled, and alumina substrate having high intensity is used for the substrate, and the deflector is fabricated by metal plating process, so that stacking and packaging is facilitated and multi layered deflectors can be fabricated.

Although the present invention has been described in conjunction with the preferred embodiment, the present invention is not limited to the embodiments, and it will be apparent to those skilled in the art that the present invention can be modified in variation within the scope of the invention.

What is claimed is:

1. A method for fabricating a deflector of a micro-column electron beam apparatus, comprising the steps of:
    (a) burying and hardening polymer in a hole formed at center of a substrate;
    (b) forming first mask pattern so that some portion of seed metal layers is exposed to form deflecting plates, wirings and pads after forming said seed metal layers on both surfaces of said substrate;
    (c) forming first metal layers on the exposed portion of said seed metal layers;
    (d) forming second mask pattern on both surfaces of said substrate to expose said first metal layers in which said deflecting plates are to be formed;
    (e) forming second metal layers on the exposed portion of said first metal layers;
    (f) removing said first and second mask patterns; and
    (g) removing said seed metal layers exposed and polymers buried in said hole.

2. The method as claimed in claim 1, further comprising:
    a step for planarizing said polymers on both surfaces of said substrate by polishing process after said step (a).

3. The method as claimed in claim 1, wherein said first mask pattern is a photoresist film, and formed by coating or laminating process.

4. The method as claimed in claim 1, wherein said first and second metal layers are made of beryllium, phosphor bronze, bronze, cupro-nickel, stainless steel, or nickel, and formed by plating process.

5. The method as claimed in claim 1, wherein said second mask pattern is made of polymers, and formed by laminating process.

6. The method as claimed in claim 1, further comprising:
    a step for plating metal on exposed surfaces of said first and second metal layers after said step (g).

7. The method as claimed in claim 6, wherein said metal is gold.

* * * * *